US012647142B2

(12) United States Patent
Ghannouchi et al.

(10) Patent No.: US 12,647,142 B2
(45) Date of Patent: Jun. 2, 2026

(54) DIGITAL MULTI-BAND PREDISTORTION LINEARIZER WITH NON-LINEAR SUBSAMPLING ALGORITHM IN THE FEEDBACK LOOP

(71) Applicants: Fadhel M. Ghannouchi, Calgary (CA); Aidin Bassam, Calgary (CA); Mohamed Helaoui, Calgary (CA); Andrew Kwan, Calgary (CA)

(72) Inventors: Fadhel M. Ghannouchi, Calgary (CA); Aidin Bassam, Calgary (CA); Mohamed Helaoui, Calgary (CA); Andrew Kwan, Calgary (CA)

(73) Assignee: Smart RF Inc., Calgary (CA)

( * ) Notice: Subject to any disclaimer, the term of this patent is extended or adjusted under 35 U.S.C. 154(b) by 0 days.

(21) Appl. No.: 17/207,614

(22) Filed: Mar. 20, 2021

(65) Prior Publication Data

US 2021/0211147 A1     Jul. 8, 2021

Related U.S. Application Data

(63) Continuation of application No. 15/583,343, filed on May 1, 2017, now Pat. No. 10,958,296, which is a
(Continued)

(51) Int. Cl.
H04B 1/04          (2006.01)
H03F 1/32          (2006.01)
(Continued)

(52) U.S. Cl.
CPC ......... H04B 1/0475 (2013.01); H03F 1/3247 (2013.01); H03F 3/189 (2013.01);
(Continued)

(58) Field of Classification Search
CPC ..... H04B 1/0475; H03F 1/3247; H03F 3/189; H03F 3/245; H04L 25/03343
See application file for complete search history.

(56) References Cited

U.S. PATENT DOCUMENTS 5,819,165 A     10/1998   Hulkko et al.
6,072,364 A  *   6/2000   Jeckeln ................. H03F 1/3247
                                                           330/149
(Continued)

FOREIGN PATENT DOCUMENTS

CN        201878098 U       6/2011
CN        101286963         10/2018
(Continued)

OTHER PUBLICATIONS

J. R. G. Oya, F. Munoz, A. Torralba, A. Jurado, A. J. Garrido and J. Banos, "Data Acquisition System Based on Subsampling for Testing Wideband Multistandard Receivers," in IEEE Transactions on Instrumentation and Measurement, vol. 60, No. 9, pp. 3234-3237, Sep. 2011, doi: 10.1109/TIM.2011.2128710. (Year: 2011).*
(Continued)

*Primary Examiner* — Jaison Joseph

(57) ABSTRACT

A concurrent multi-band linearized transmitter (CMLT) has a concurrent digital multi-band predistortion block (CDMPB) and a concurrent multi-band transmitter (CMT) connected to the CDMPB. The CDMPB can have a plurality of digital baseband signal predistorter blocks (DBSPBs), an analyzing and modeling (A&M) stage, and a signal observation feedback loop. Each DBSPB can have a plurality of inputs, each corresponding to a single frequency band of the multi-band input signal, and its output corresponding to a single frequency band; each output connect corresponding to an input of the CMLT. The A&M stage can have a plurality of outputs connected to and updating the parameters of the DBSPBs, and a plurality of inputs connected to either both
(Continued)

outputs of the signal observation loop or the output of the subsampling loop and to outputs of the DBSPBs. The A&M stage can perform signals' time alignment, reconstruction of signals and compute parameters of DBSPBs.

27 Claims, 7 Drawing Sheets

Related U.S. Application Data continuation of application No. 14/467,642, filed on Aug. 25, 2014, now Pat. No. 9,641,204, which is a continuation of application No. 13/274,290, filed on Oct. 14, 2011, now Pat. No. 8,817,859.

(51) Int. Cl.
  *H03F 3/189*      (2006.01)
  *H03F 3/24*       (2006.01)
  *H04L 25/03*      (2006.01)

(52) U.S. Cl.
  CPC ....... *H03F 3/245* (2013.01); *H04L 25/03343*
    (2013.01); *H03F 2200/111* (2013.01); *H03F*
      *2200/204* (2013.01); *H03F 2200/207*
    (2013.01); *H03F 2200/408* (2013.01); *H04B*
      *2001/0425* (2013.01); *H04L 2025/03356*
                                (2013.01)

(56)                References Cited

U.S. PATENT DOCUMENTS

| | | | |
|---|---|---|---|
| 6,999,523 | B2 | 2/2006 | Posti |
| 7,035,345 | B2 | 4/2006 | Jeckeln |
| 7,110,732 | B2 | 9/2006 | Mostafa |
| 7,336,716 | B2 | 2/2008 | Maltsev et al. |
| 7,415,252 | B2 | 8/2008 | Jelonnek et al. |
| 8,260,143 | B2 | 9/2012 | Gupta et al. |
| 8,294,516 | B2 * | 10/2012 | Young .................. H03F 3/68 |
| | | | 330/149 |
| 8,380,144 | B1 * | 2/2013 | Bai .................. H04B 1/0475 |
| | | | 455/114.3 |
| 8,391,809 | B1 * | 3/2013 | Fuller .................. H04B 1/0475 |
| | | | 455/114.3 |
| 8,526,898 | B2 | 9/2013 | Reddy et al. |
| 8,576,943 | B2 | 11/2013 | Kilambi |
| 8,767,857 | B2 | 7/2014 | Bassam et al. |
| 8,873,674 | B2 | 10/2014 | Kim |
| 2002/0191710 | A1 * | 12/2002 | Jeckeln .................. H03F 1/3247 |
| | | | 375/296 |
| 2003/0053552 | A1 | 3/2003 | Hongo et al. |
| 2003/0104794 | A1 | 6/2003 | Yang et al. |
| 2003/0179830 | A1 | 9/2003 | Eidson |
| 2005/0162225 | A1 * | 7/2005 | Suzuki .................. H03F 1/3241 |
| | | | 330/149 |
| 2005/0163251 | A1 | 7/2005 | McCallister |
| 2005/0168283 | A1 * | 8/2005 | Suzuki .................. H03F 1/3241 |
| | | | 330/149 |
| 2005/0242876 | A1 | 11/2005 | Obernosterer |
| 2006/0276147 | A1 * | 12/2006 | Suzuki .................. H03F 1/3258 |
| | | | 455/114.3 |
| 2007/0216554 | A1 | 9/2007 | Ahmed |
| 2008/0152037 | A1 * | 6/2008 | Kim .................. H04L 25/03343 |
| | | | 375/297 |
| 2008/0238544 | A1 | 10/2008 | Morris et al. |
| 2011/0156815 | A1 * | 6/2011 | Kim .................. H03F 1/3258 |
| | | | 330/149 |
| 2011/0187437 | A1 | 8/2011 | Perreault et al. |
| 2012/0069880 | A1 * | 3/2012 | Lemson .................. H04B 1/18 |
| | | | 375/220 |
| 2012/0069931 | A1 * | 3/2012 | Gandhi .................. H04L 5/06 |
| | | | 375/296 |
| 2012/0154038 | A1 * | 6/2012 | Kim .................. H04L 27/2626 |
| | | | 330/149 |
| 2013/0064325 | A1 * | 3/2013 | Kilambi .................. H03F 1/3247 |
| | | | 375/297 |
| 2013/0183915 | A1 * | 7/2013 | Bai .................. H03F 1/3294 |
| | | | 455/114.3 |
| 2015/0049841 | A1 * | 2/2015 | Laporte .................. H03F 1/34 |
| | | | 375/297 |
| 2015/0256216 | A1 * | 9/2015 | Ding .................. H04L 25/03012 |
| | | | 375/297 |
| 2015/0318880 | A1 * | 11/2015 | Rexberg .................. H03F 1/02 |
| | | | 375/297 |
| 2016/0094253 | A1 * | 3/2016 | Weber .................. H03M 1/1245 |
| | | | 455/114.3 |
| 2020/0021253 | A1 * | 1/2020 | Ghannouchi .................. H03F 3/20 |
| 2020/0119755 | A1 * | 4/2020 | Mahmood .................. H04B 1/0475 |

FOREIGN PATENT DOCUMENTS

| | | |
|---|---|---|
| EP | 2040375 | 3/2009 |
| EP | 2146474 | 1/2010 |
| WO | WO2012/129768 | 10/2012 |

OTHER PUBLICATIONS

Y.Y. Woo et al., Adaptive Digital Feedback Predistortion Technique for Linearizing Power Amplifiers, Jun. 2007IEEE Transactions on Microwave Theory and Techniques 55(5):932-940, U.S.

Nazim Ceylan, Linearization of power amplifiers by means of digital predistortion, 2006.

Cidronali et al., A new approach for concurrent Dual-Band IF Digital PreDistortion: System Design and Analysis, 2008.

Bassam et al., Crossover Digital Predistorer for the Compensation of Crosstalk and Nonlinearity in MIMO Transmitters, IEEE May 2009.

Zhurbenko, Advanced Microwave Circuits and Systems, Apr. 2010, Croatia.

Altera Corporation, Digital Predistortion Reference Design, Jul. 2003.

Barrak et al. , Optimized Multistandard RF Subsampling Receiver Architecture, Jun. 2009, IEEE Transactions on Wireless Communications.

Zhu et al., Open-Loop Digital Predistorter for RFPower Amplifiers Using Dynamic Deviation Reduction Based Volterra Series, Jul. 2008 IEEE Transactions on Microwave Theory and Techniques 56(7):1524-1534.

Dennis Morgan, "A Generalized Memory Polynomial Model for Digital Predistortion of RF Power Amplifiers," IEEE Transactions on Signal Processing, vol. 54, No. 10, (Oct. 2006).

Henna Paaso, "Comparison of Direct Learning and Indirect Learning Predistortion Architectures," 2008 IEEE International Symposium on Wireless Communication Systems (2008).

Dayong Zhou, "Novel Adaptive Nonlinear Predistorters Based on the Direct Learning Algorithm," IEEE Transactions on Signal Processing, vol. 55, No. 1, (Jan. 2007).

Youngcheol Park, "Adaptive Predistortion Linearization of RF Power Amplifiers Using Lookup Tables Generated from Subsampled Data," 2002 IEEE Radio and Wireless Conference (2002).

Qizheng Gu, RF System Design of Transceivers for Wireless Communications—Excerpts (Springer 2005).

R. Venkataramani and Y. Bresler, "Perfect reconstruction formulas and bounds on aliasing error in sub-Nyquist nonuniform sampling of multiband signals," in IEEE Transactions on Information Theory, vol. 46, No. 6, pp. 2173-2183, (Sep. 2000).

R. Venkataramani, "Sub-Nyquist multicoset and MIMO sampling: Perfect reconstruction, performance analysis, and necessary density conditions," University of Illinois at Urbana-Champaign ProQuest Dissertations & Theses (2001).

Allen Katz, "Linearization: Reducing Distortion in Power Amplifiers," IEEE Microwave Magazine (2001).

Lei Ding, Raviv Raich, et al., "A Hammerstein Predistortion Linearization Design Based on the Indirect Learning Architecture," 2002 IEEE International Conference on Acoustics, Speech, and Signal Processing (2002).

(56) References Cited

OTHER PUBLICATIONS

Lei Ding, "Digital Predistortion of Power Amplifiers for Wireless Applications", A Thesis Presented to the Academic Faculty, School of Electrical and Computer Engineering, Georgia Institute of Technology (2004).

Ronald Crochiere, Multirate Digital Signal Processing—Excerpts (Prentice Hall 1983).

Leon Couch, Digital and Analog Communication Systems—Excerpts (Macmillan Publishing 1987).

John Proakis, Communication Systems Engineering—Excerpts (Prentice Hall 2002).

IEEE Std 100-2000, The Authoritative Dictionary of IEEE Standards Terms, Seventh Edition (2000)—Excerpts.

Choi et al. "Design of Digital Predistorters for Multi-Band Signals", Proceedings of the Second APSIPA Annual Summit and Conference, pp. 133-136, Biopolis, Singapore, Dec. 14-17, 2010.

* cited by examiner

| RF SIGNALS AT THE TRANSMITTER OUTPUT | | |
|---|---|---|
| | Harmonic | RF Freq. (MHz) |
| a | $f_1$ | 880 |
| b | $f_2$ | 1978 |
| c | $f_2 - f_1$ | 1098 |
| d | $2f_1$ | 1760 |
| e | $f_1 + f_2$ | 2858 |
| f | $2f_2$ | 3956 |
| g | $f_2 - 2f_1$ | 218 |
| h | $3f_1$ | 2640 |
| i | $2f_2 - f_1$ | 3076 |
| j | $2f_1 + f_2$ | 3738 |
| k | $3f_1 - f_2$ | 662 |
| l | $2f_2 - 2f_1$ | 2196 |
| m | $4f_1$ | 3520 |
| n | $2f_2 - 3f_1$ | 1316 |
| o | $4f_1 - f_2$ | 1542 |

| BASEBAND FREQUENCIES USING A SUBSAMPLED FREQUENCY OF 619.8 MHz | | |
|---|---|---|
| | Harmonic | Subsampled Freq. (MHz) |
| a | $f_1$ | 260.20 |
| b | $f_2$ | 118.60 |
| c | $f_2 - f_1$ | 141.60 |
| d | $2f_1$ | 99.40 |
| e | $f_1 + f_2$ | 241.00 |
| f | $2f_2$ | 237.20 |
| g | $f_2 - 2f_1$ | 218.00 |
| h | $3f_1$ | 160.80 |
| i | $2f_2 - f_1$ | 23.00 |
| j | $2f_1 + f_2$ | 19.20 |
| k | $3f_1 - f_2$ | 42.20 |
| l | $2f_2 - 2f_1$ | 283.20 |
| m | $4f_1$ | 198.80 |
| n | $2f_2 - 3f_1$ | 76.40 |
| o | $4f_1 - f_2$ | 302.40 |

DIGITAL MULTI-BAND PREDISTORTION LINEARIZER WITH NON-LINEAR SUBSAMPLING ALGORITHM IN THE FEEDBACK LOOP

CROSS REFERENCE TO RELATED APPLICATIONS

This application is a Continuation of U.S. Ser. No. 15/583,343 filed May 1, 2017 which is a Continuation of U.S. Ser. No. 14/467,642 filed Aug. 25, 2014 which is a Continuation of U.S. Ser. No. 13/274,290 filed Oct. 14, 2011, all of which are in their entirety incorporated herein by reference.

FIELD

The present invention relates to multi-band digital pre-distortion linearization.

RELATED ART

Power-efficient, low-complex, and reconfigurable radio system requires the design of energy-efficient transmitter and receiver architectures. At the transmitter side, the power consumption is mainly dominated by the RF power amplification (PA) unit. Generally, PAs are the most power consuming and the least power efficient components of the RF chain. Moreover, their nonlinear behavior and non-flat frequency response introduce unwanted intermodulation distortions into the system, which could significantly degrade the output signal quality.

An efficient and proper approach to linearize the transmitter nonlinearities, including the frequency up-conversion and power amplification units, is digital predistortion (DPD) linearization technique. The DPD technique is based on developing a reverse model of the nonlinear behavior and predistorted the input signals accordingly in order to compensate for the distortions and nonlinearities introduced by the transmitter.

In dual-band system, the nonlinear behavior of the device will introduce intermodulation, cross modulation, and harmonic products caused by the two fundamental signals. This can be extended to multi-band systems where more than two active signals are transmitted simultaneously.

The linearization of multi-band transmitter is based on the digital predistortion linearization. The DPD technique compensates for the transmitter nonlinearity while operating in the high efficiency and nonlinear region. As an example presented here in this patent, two signal processing blocks are employed to deal and compensate for the unwanted distortions and intermodulation products of the dual-band transmitter. In the scenario of multi-band transmitter (dual-band or more) this processing architecture can be expanded to multiple processing block for linearization and distortion compensation of multi-band transmitter.

To obtain samples of the signal from the output of the multi-band system, multi-branch or multi-band down converter is required in the feedback loop. This feedback loop can be developed using multi-band down conversion unit, multi-branch down conversion unit, or using subsampling based down conversion unit.

In one case, an energy-efficient and low-complex sub-sampling receiver is adopted in the feedback loop of the multi-band linearization architecture. The subsampling receiver architecture is designed to concurrently down-convert the multiple RF signals through single receiver chain. Using subsampling technique simplifies the feedback loop topology, requires fewer number of RF components, and reduces the power consumption.

Substituting the multi-band or multi-branch receiver feedback loop of the linearization topology with subsampling receiver architecture reduces the complexity of the system. The subsampling down conversion is not very common as receivers because of its insufficient performance in the presence of uncontrolled interfering signals. However, in the case of a DPD feedback loop, the problem is different and the interfering signals can be controlled such that they will not affect the signal quality. The different intermodulation, cross modulation and harmonic products make choosing the sampling frequency a complex task in order to avoid any overlap between the down-converted desired signals and their intermodulation and cross modulation products. Therefore, it is imperative to develop an algorithm to select the sampling frequency so that it takes into account all the possible frequencies such that the target signals will not be interfered with the undesired product terms.

SUMMARY

In one aspect of the present invention, a concurrent digital multi-band linearizer compromises a baseband signal pre-processing block, the baseband signal processing block including a digital predistortion unit; a signal up-conversion block, an RF power amplification block, the RF power amplification block including the concurrent multi-band power amplifier; and an RF power combining network.

In the description of the invention, a concurrent dual-band amplifier will be used. It is noted that a concurrent dual-band power amplifier which includes one amplification unit for two frequency bands may be considered in one sense a simple and special case of multi-band power amplifiers.

In one aspect of the present invention, the feedback loop of the digital predistortion consists of multiple RF down-conversion units associated with each of the frequency band of operation.

In another aspect of the present invention, a single feedback loop based on subsampling receiver technique is used to down-convert and extract the RF signals form all the frequency band at the same time.

Further areas of applicability of the present invention will become apparent with reference to the following drawings, description and claims. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION

The following description of the preferred embodiment(s) is merely exemplary in nature and is in no way intended to limit the invention, its application, or uses.

Broadly, an embodiment of the present invention provides multiple branch digital predistortion linearization architecture and digital signal processing algorithms for impairments-free operation and linearized multi-band transmitter.

Figure 1:
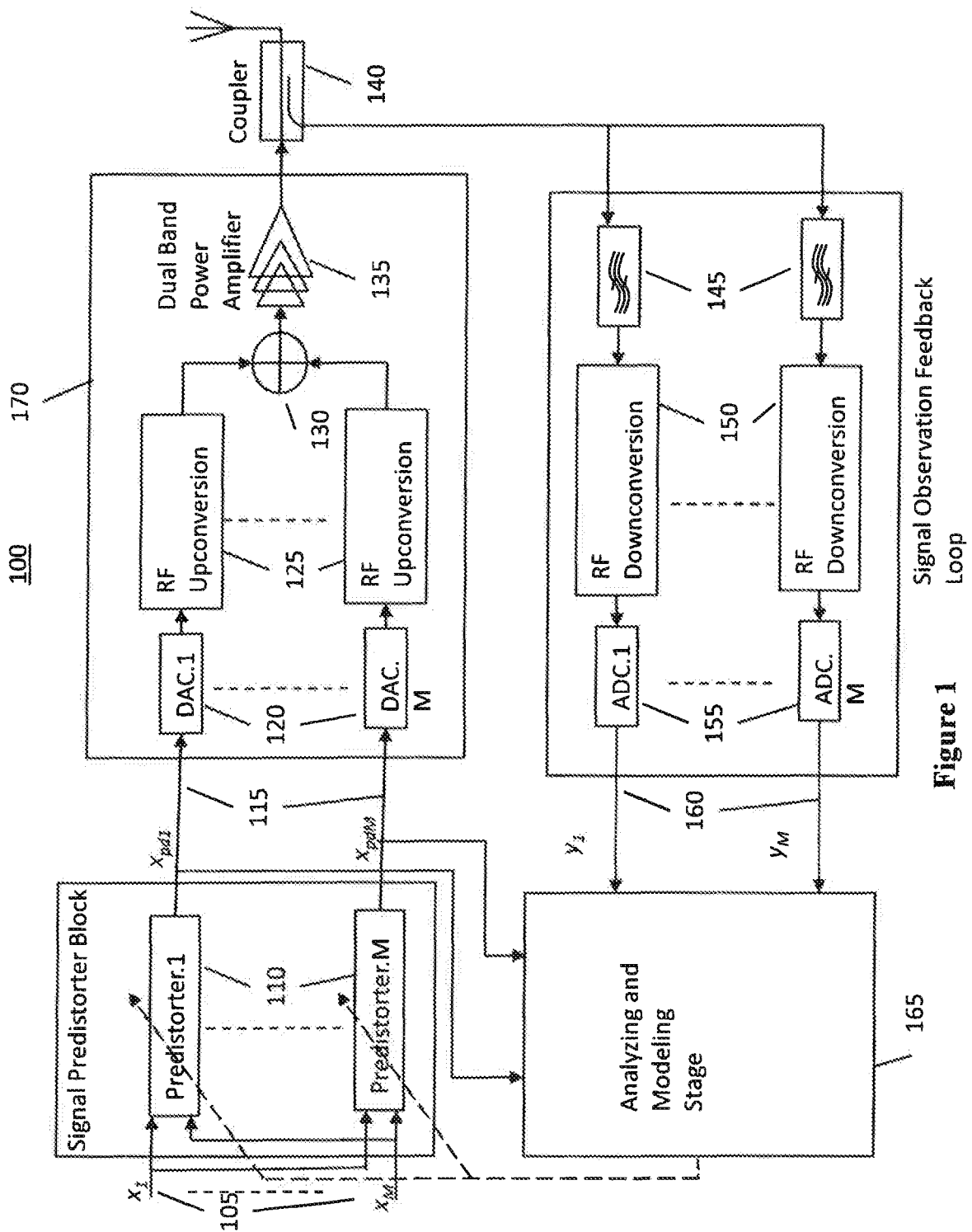
FIG. 1 is a block diagram of the dual-band digital pre-distortion architecture according to an exemplary embodiment of the present invention.

Referring to FIG. 1, the system block diagram of the dual-band linearization architecture 100 is displayed. The input signals, x1 and x2, 105 are fed into two distinct predistorters blocks 110. The predistorted signals 115 are converted from digital to analog 120 and up-converted 125 to RF frequencies. Then the two RF signals are combined 130 and amplified by the power amplifier 135.

For digital predistortion linearization and identify the inverse model, the sample of the RF signal are captured using dual-band coupler 140. Then the RF signals are bandpass filtered 145, frequency down converted 150, digitized using analog-to-digital converters 155. The digital output samples 160, the input signals 105 and predistorted signals 115 are used in the analyzing stage 165 for nonlinear model identification and reverse modeling.

The feedback path of the dual-band linearizer requires the use of two down-conversion stages 150, as well as bandpass filters 145 to remove most of the imperfections caused by the power amplifier. The predistorted inputs, $x_{pd1}$ and x $x_{pd2}$, 115 as well as the output of each band of the PA, $y_1$ and $y_2$, 160 are used to generate the predistorter signal processing model 110. The processing model equations of the linearization processing algorithm 165 for prediction and compensation of the distortions and intermodulations is as follows:

$$x_{pd1}(n) = \sum_{m=0}^{M-1}\sum_{k=0}^{K-1}\sum_{j=0}^{k} c_{1,j,k,m} x_1(n-m)|x_1(n-m)|^{k-j}|x_2(n-m)|^{j} \quad (1)$$

$$x_{pd2}(n) = \sum_{m=0}^{M-1}\sum_{k=0}^{K-1}\sum_{j=0}^{k} c_{2,j,k,m} x_2(n-m)|x_2(n-m)|^{k-j}|x_1(n-m)|^{j}$$

Where $x_1(n)$ and $x_2(n)$ are the input signals, $x_{pd1}(n)$ and $x_{pd2}(n)$ are the predistorted signals to the input of the dual-band transmitter, $c_{1,j,k,m}$ and $c_{2,j,k,m}$ are the indentified model's coefficients, and finally M is the order of the memory effect and K is the order of nonlinearity.

Concurrent multi-band receiver architectures require a bandpass filter 145, down-conversion stage 150, and ADC 155 for the translation of each RF frequency bands to baseband. Using subsampling with a high speed ADC allows the elimination of all these components; however, the user needs to make sure that the signals don't overlap in the subsampled spectral domain.

Figures 2, 3:
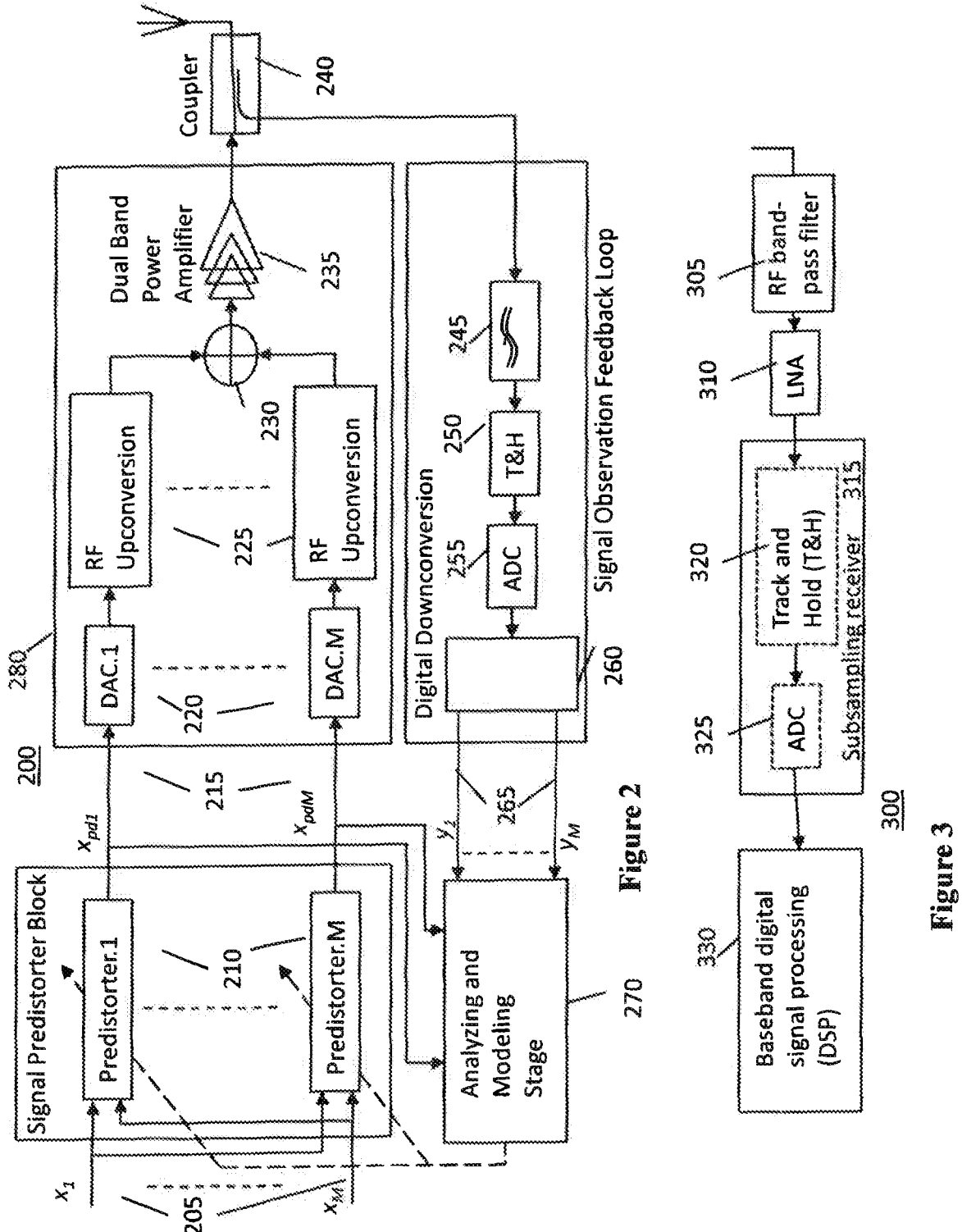
FIG. 2 is an alternate embodiment illustrating a detailed block diagram of the architecture of FIG. 1, using subsampling based feedback loop.
FIG. 3 is one embodiment illustrating a detailed block diagram of the subsampling receiver architecture of FIG. 2.

Sampling multi-bands at the same time also eliminates the time delay taken between different band paths caused by the filters. FIG. 2 displays the dual-band predistortion architecture with a subsampling feedback loop 200. At the feedback loop, it consists of optional bandpass filters 245, a track and hold 250, an analog-to-digital converter 255, a digital conversion unit 260, and analyzing stage 270.

Sampling the band-limited RF signal at frequency rates much lower than the carrier frequency, but higher than signal bandwidth folds the RF signal to the lower frequencies, where these replicates of the RF signal at baseband or intermediate frequencies can be used to reconstruct the baseband signal. To make sure that there is no aliasing between the replicas, the subsampling rate should be chosen in the following range:

$$\frac{2f_U}{n} \le f_s \le \frac{2f_L}{n-1} \text{ where } 1 \le n \le \left\lfloor \frac{f_U}{B} \right\rfloor \quad (2)$$

$$f_s \ge 2 \times B \text{ Nyquist rate}$$

where $f_L$ and $f_U$ are the lower and upper frequencies of the band-limited RF signal, $B=f_U-f_L$ is the signal bandwidth, and n is an integer value.

FIG. 3 shows a general block diagram of subsampling-based receiver 300. It consists of RF bandpass filter 305, low-noise amplifier (LNA) 310, subsampling receiver 345 including the track and hold (T&H) 320, and ADC 325 followed by baseband digital signal processing (DSP) unit 330. The T&H 320 is required to expand the analog bandwidth of the receiver and defines the RF range of receiver operation. The sampling clock of the T&H 320 and ADC 325 are chosen from (2) to avoid any aliasing with the other RF signals.

Figure 4A:
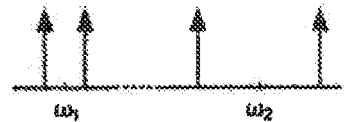
FIG. 4A is the fundamental signal representation at the input of the dual-band transmitter.
Figure 4B:
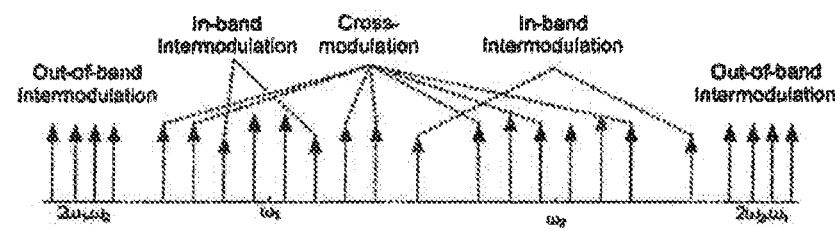
FIG. 4B is the fundamental signal representation at the output of the dual-band transmitter and intermodulation terms at the output of the nonlinear transmitter.

In dual-band operation transmitter with nonlinearity, the first and second bands will produce intermodulation, cross modulation and harmonic products. FIG. 4 shows the power spectrum of the input signal, and the output signal when passed through a third order nonlinear system. The input signals as two-tone signal around carrier frequencies of $\omega_1$ and $\omega_2$ (FIG. 4(a)) the output signals are around carrier frequencies of $\omega_1$ and $\omega_2$ and the 3rd order intermodulation frequencies of 2 $\omega_1-\omega_1$ and 2 $\omega_2-\omega_1$ (FIG. 4(b)). The unwanted intermodulation can be classified into three groups of cross-modulation, in-band intermodulation, and out-of-band intermodulation terms. This latter is usually filtered out before transmission using RF filter to avoid signal quality degradation and interference with the signals at the adjacent channels.

Figure 5:
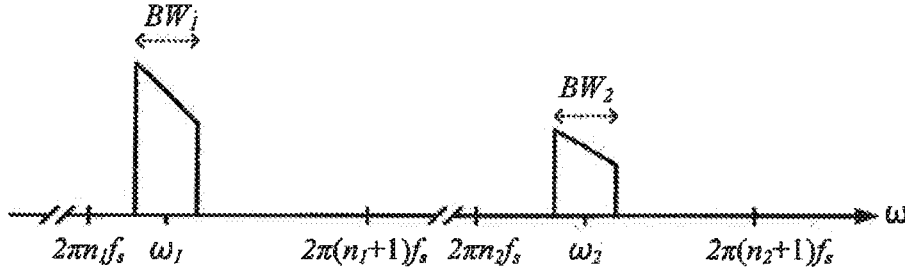
FIG. 5 is dual-band RF signal and the frequency position of the subsampling harmonics.

Now considering two RF signals at carrier frequencies of $\omega_2$ and $\omega_2$, with their respective bandwidths B1 and B2 as shown in FIG. 5, the subsampling frequency, fs, must be chosen to ensure that the two signals do not overlap in the subsampled domain. Taking into account the subsampling theorem for sampling the multi-band signals and following the neighbor and boundary constraints, an iterative process is used to find all the valid subsampling frequencies for the two fundamental frequencies.

Figure 6:
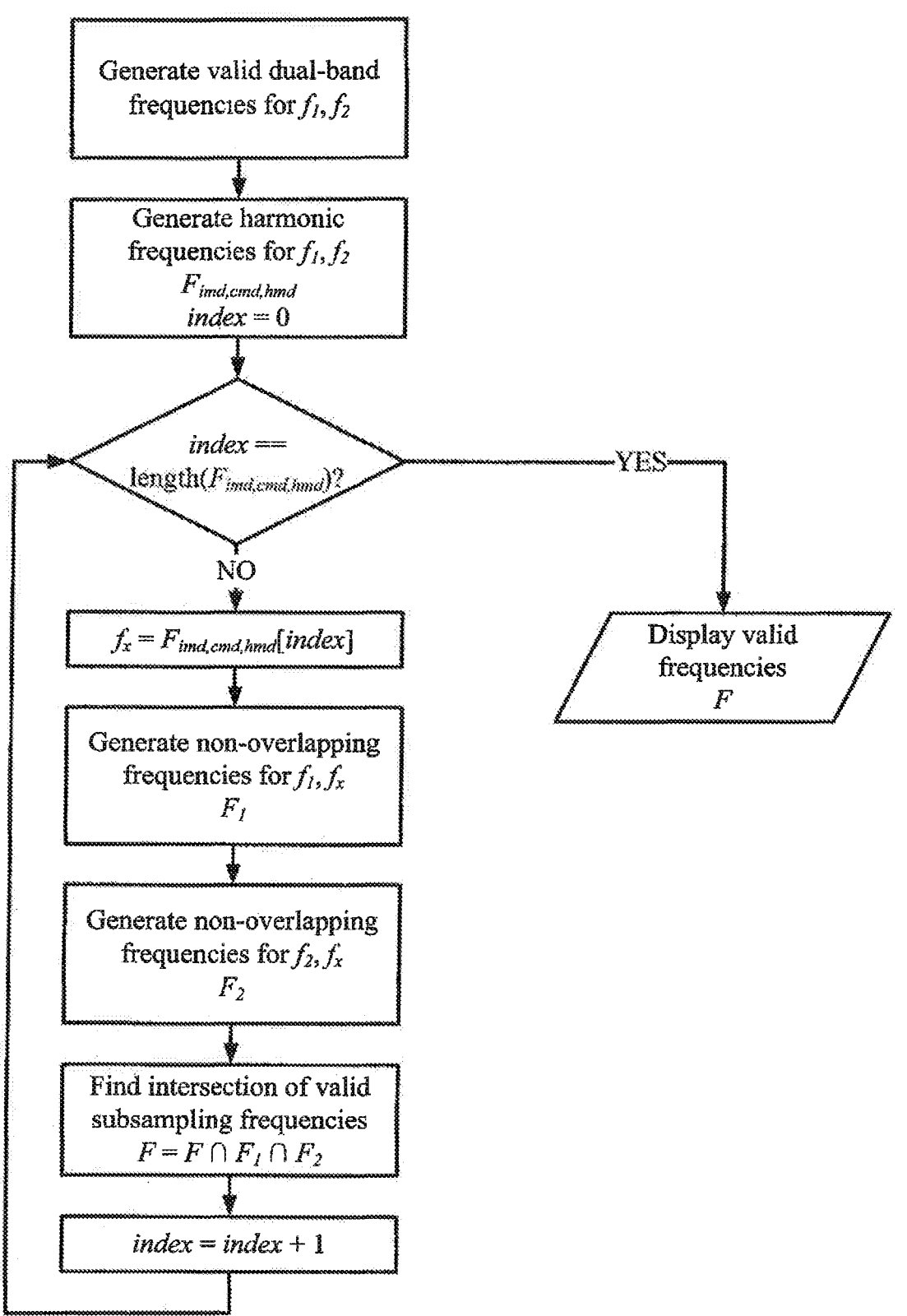
FIG. 6 is a flowchart illustrating the steps of the execution of finding the possible subsampling frequencies.

The, out-of-band intermodulation-modulation, and harmonics generated by the fundamental signals are not required for the predistortion application; therefore, an iterative subsampling algorithm has been developed to subsample the RF signals without any overlap with the other unwanted RF signals. FIG. 6 is the flowchart of the developed iterative subsampling algorithm to find the valid subsampling frequencies so that the replicas of the wanted RF signals have no overlap with the harmonics and intermodulation frequency terms.

Figure 7A:
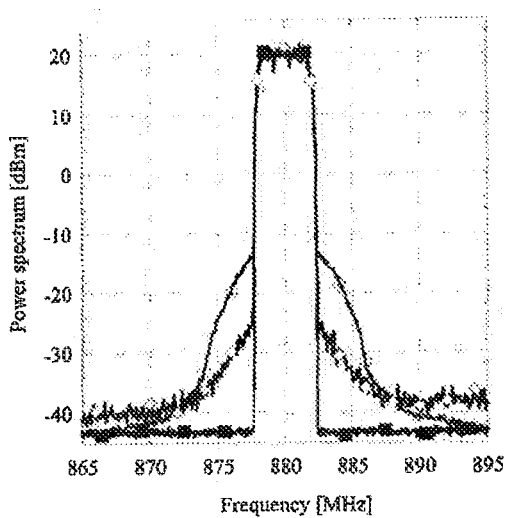
FIG. 7A is the power spectrum of the predistortion results for 880 MHz, using dual-band digital prediction technique with dual-branch feedback loop. Spectrums marked with circles are the output without linearization, those marked with diamonds are the output after linearization, and those marked with solid rectangles are the inputs signals.
Figure 7B:
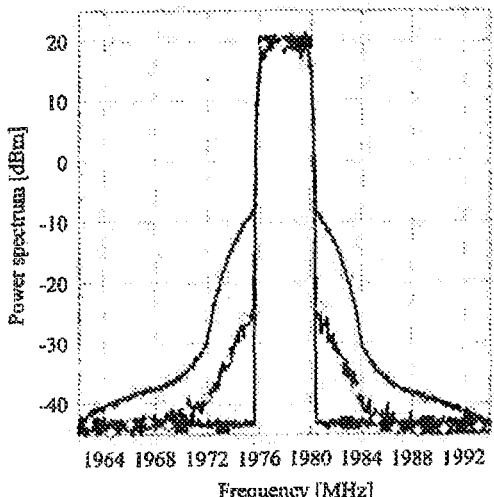
FIG. 7B is the power spectrum of the predistortion results for 1978 MHz, using dual-band digital prediction technique with dual-branch feedback loop, using the same codes as described for FIG. 7A.

Referring to FIG. 7, there is shown the measured output spectrum of the dual-band transmitter 170 for three cases: 1) without using the dual-band digital pre-compensator 110, 2) using the dual-band digital pre-compensator 110 3) the input signal. The output spectrum of case-2 with digital pre-compensator shows that the digital pre-compensator 110 can compensate for the cross-modulation and in-band inter-modulation terms introduced by the transmitter nonlinearity.

Figure 8:
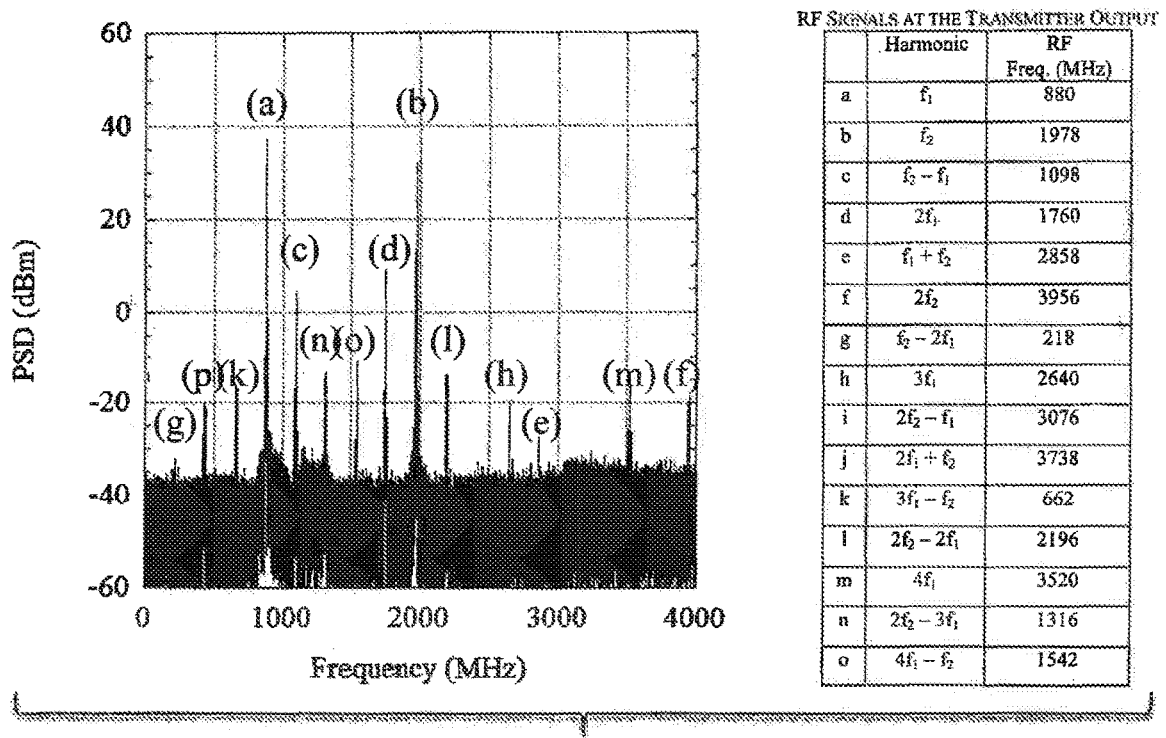
FIG. 8 is the Power spectrum of the output of the dual-band nonlinear transmitter including the two fundamental RF signals and their inter-modulation products and harmonics.

Referring to FIG. 8, there is an example of the power spectrum at the output of the concurrent dual-band nonlinear transmitter which contains two fundamental RF frequencies and their corresponding harmonics and inter-modulation products.

Figure 9:
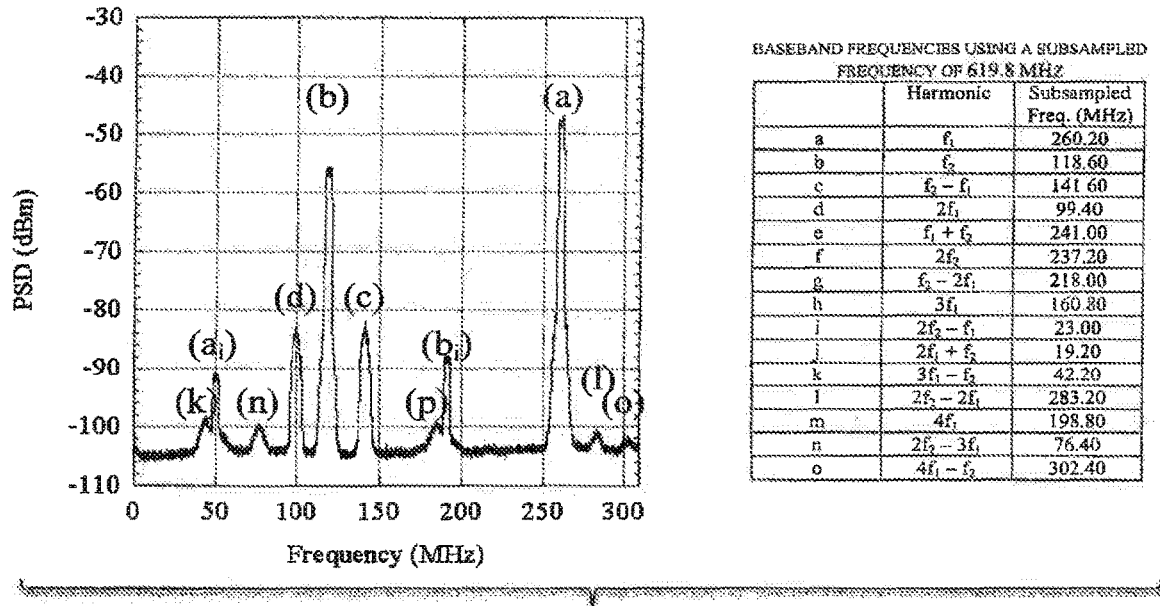
FIG. 9 is the Power spectrum of the captured signal using an ADC operating at 619.8 MHz sampling frequency.

As an example for the application of this invention, FIG. 9, points up the power spectrum after the subsampling feedback loop which shows the two fundamental RF signals at 260.2 MHz and 118.6 MHz when the subsampling frequency of 619.8 is used following is determination by the developed iterative subsampling algorithm illustrated in FIG. 6. The spectrum in FIG. 9 shows that the harmonics and inter-modulation terms have no interference with the two desired fundamental signals.

Figure 10A:
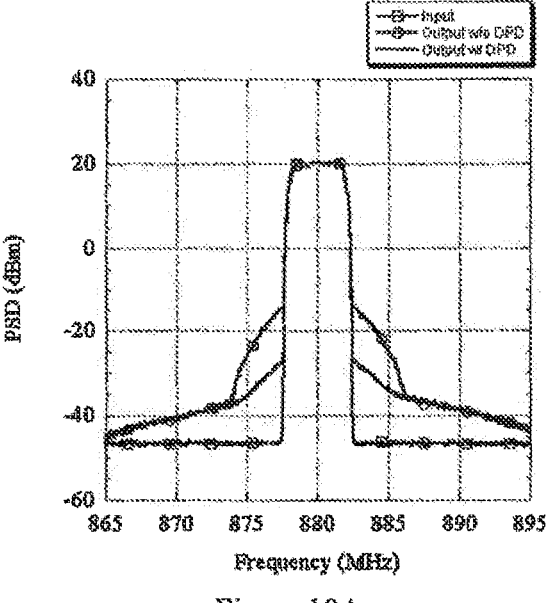
FIG. 10A is the power spectrum of the predistortion results for 880 MHz. using dual-band digital prediction technique with subsampling feedback loop.
Figure 10B:
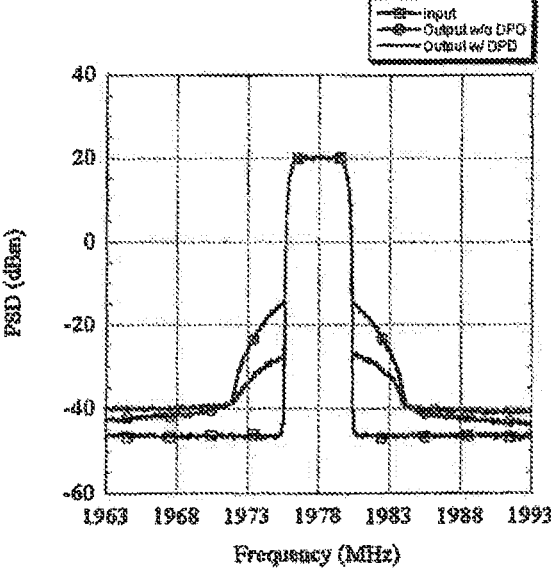
FIG. 10B is the power spectrum of the predistortion results for 1978 MHz, using dual-band digital prediction technique with subsampling feedback loop.

Referring to FIG. 10, there is shown the measured output spectrum of the dual-band transmitter 280 for three cases: 1) without using the dual-band digital pre-compensator 210, 2) using the dual-band digital pre-compensator 210, 3) the input signal. The output spectrum of case-2 with digital pre-compensator shows that the digital pre-compensator 210 can compensate for the cross-modulation and in-band inter-modulation terms introduced by the transmitter dynamic nonlinearity with memory effects.

What is claimed is:

1. A linearized transmitter comprising:
   a digital predistorter block in a transmit signal path effecting signal distortion to output a plurality of distinct concurrent predistorted signals, each of the distinct concurrent predistorted signals being a function of a single input signal;
   a transmitter block connected in the transmit signal path for combining said plurality of distinct concurrent predistorted signals for transmission by a power amplifier block;
   a signal observation feedback receiver block coupled in a signal observation feedback path configured with a down converting subsampling operation to generate a plurality of concurrent and distinct feedback signals; and
   an analyzing and modelling block configured to use the concurrent and distinct feedback signals for synthesizing predistorter coefficients for the digital predistorter block.

2. The linearized transmitter of claim 1, wherein said analyzing and modeling block is further configured to align delays and phases of the concurrent and distinct feedback signals.

3. The linearized transmitter of claim 1, wherein said down converting subsampling operation simultaneously and concurrently down converts all bands of an observed multiband signal.

4. The linearized transmitter of claim 1, wherein the subsampling operation is over multiple frequency segments.

5. The linearized transmitter of claim 2, wherein the signal distortion is performed in parallel on at least two signals.

6. The linearized transmitter of claim 1, said transmitter having hardware impairments, nonlinearities, harmonic distortions, memory effects and intermodulation distortion.

7. The linearized transmitter of claim 1, said input signal being a multiband signal and wherein the concurrent predistorted signals being a representation of at least two distinct band signals.

8. The linearized transmitter of claim 1, said digital predistorter block configured to compensate for hardware impairments, distortion and nonlinearities of said transmitter.

9. The linearized transmitter of claim 1, said digital predistorter block configured to compensate for memory effects of said transmitter.

10. The linearized transmitter of claim 1, said digital predistorter block configured to compensate for intermodulation and harmonic distortion.

11. The linearized transmitter of claim 1, said digital predistorter block configured to compensate for in-band intermodulation distortion and cross-band intermodulation.

12. The linearized transmitter of claim 1, said digital predistorter block including a predistortion model, said model being selected to compensate for intermodulation and cross-modulation products.

13. The linearized transmitter of claim 12, wherein the synthesized predistorter coefficients are for said compensation of said intermodulation and said cross-modulation products.

14. A method for linearizing a transmitter, the method comprising:
   effecting predistortion, in parallel, of signal components; applied to a digital predistorter block in a transmit signal path, to output a plurality of distinct concurrent predistorted signals, each of the distinct concurrent predistorted signals being a function of the signal components;
   combining said plurality of distinct concurrent predistorted signals to form a multiband signal to be transmitted by a power amplifier block;
   subsampling, in a signal observation feedback path to generate a plurality of concurrent and distinct feedback signals; and
   using the concurrent and distinct feedback signals for synthesizing predistorter coefficients for the digital predistorter block.

15. The linearized transmitter of claim 14, said digital predistorter block compensating for hardware impairments, distortions and nonlinearities of said transmitter.

16. The linearized transmitter of claim 14, said digital predistorter block compensating for memory effects of said transmitter.

17. The linearized transmitter of claim 14, said digital predistorter block compensating for intermodulation and cross modulation products.

18. The linearized transmitter of claim 14, said digital predistorter block compensating for in-band intermodulation distortion and cross-band intermodulation distortion.

19. The linearized transmitter of claim 14, said digital predistorter block including a predistortion model, said model being selected to compensate for intermodulation and cross-modulation products.

20. The linearized transmitter of claim 19, wherein the synthesized predistorter coefficients are for said compensation of said intermodulation and said cross-modulation products.

21. A method for a concurrent multiband receiver, the method comprising:

receiving a multiband signal; and generating from the multiband signal, in at least one down converting subsampling operation, concurrent and distinct signals, each corresponding to respective distinct bands, the subsampling frequency being selected to preclude, aliasing between the concurrent and distinct signals.

22. A transmitter comprising:

a concurrent digital multiband predistortion block configured to effect concurrent predistortion of respective band signals of a multiband signal to compensate for nonlinearities in the transmitter;

a power amplifier block configured to amplify a predistorted multiband signal to provide an amplified multiband signal; and a signal observation feedback loop configured with a concurrent sampling block for concurrently sampling respective band signals corresponding to respective bands of the amplified multiband signal to produce concurrent feedback signals, the sampling being at a subsampling frequency lower than twice the highest signal frequency applied to the sampling block.

23. The transmitter of claim 22, wherein the feedback loop is further configured to effect concurrent frequency down conversion of the respective bands of the amplified multiband signal prior to the sampling block.

24. The transmitter of claim 22, the subsampling frequency being selected to preclude aliasing between distinct ones of the concurrent feedback signals.

25. The transmitter of claim 24, wherein the aliasing includes at least one of the harmonics and intermodulation of the concurrent feedback signals.

26. A method for linearizing a transmitter comprising:

configuring a concurrent digital multiband predistortion block to effect concurrent predistortion of respective band signals of a multiband signal to compensate for nonlinearities in the transmitter;

amplifying a predistorted multiband signal in a power amplifier block to provide an amplified multiband signal; and concurrently sampling, in a concurrent sampling block of a feedback loop, respective band signals corresponding to respective bands of the amplified multiband signal to produce concurrent feedback signals, the sampling being at a subsampling frequency lower than twice the highest signal frequency applied to the sampling block.

27. The method of claim 26, wherein the feedback loop is further configured to effect concurrent frequency down conversion of the respective band signals corresponding to the respective bands of the amplified multiband signal prior to the sampling block.

* * * * *